(12) United States Patent
Talledo

(10) Patent No.: US 9,847,281 B2
(45) Date of Patent: Dec. 19, 2017

(54) LEADFRAME PACKAGE WITH STABLE EXTENDED LEADS

(71) Applicant: STMicroelectronics, Inc., Calamba (PH)

(72) Inventor: Jefferson Talledo, Calamba (PH)

(73) Assignee: STMICROELECTRONICS, INC., Calamba (PH)

( * ) Notice: Subject to any disclaimer, the term of this patent is extended or adjusted under 35 U.S.C. 154(b) by 0 days.

(21) Appl. No.: 14/788,303

(22) Filed: Jun. 30, 2015

(65) Prior Publication Data
US 2017/0005028 A1  Jan. 5, 2017

(51) Int. Cl.
*H01L 23/495* (2006.01)
*H01L 23/00* (2006.01)
*H01L 23/31* (2006.01)
*H01L 21/56* (2006.01)
*H01L 23/29* (2006.01)

(52) U.S. Cl.
CPC ...... *H01L 23/49541* (2013.01); *H01L 21/568* (2013.01); *H01L 23/3121* (2013.01); *H01L 23/49503* (2013.01); *H01L 23/49531* (2013.01); *H01L 24/17* (2013.01); *H01L 24/48* (2013.01); *H01L 23/293* (2013.01); *H01L 23/296* (2013.01); *H01L 2224/16245* (2013.01); *H01L 2224/32245* (2013.01); *H01L 2224/48091* (2013.01); *H01L 2224/48247* (2013.01); *H01L 2224/48465* (2013.01); *H01L 2224/73265* (2013.01); *H01L 2224/81801* (2013.01); *H01L 2224/83005* (2013.01); *H01L 2224/85005* (2013.01); *H01L 2224/85801* (2013.01)

(58) Field of Classification Search
CPC ............ H01L 21/4821; H01L 21/4839; H01L 23/49861; H01L 23/49541
USPC .......................... 438/123, 124; 257/666–677
See application file for complete search history.

(56) References Cited

U.S. PATENT DOCUMENTS

| | | | |
|---|---|---|---|
| 6,455,348 B1 * | 9/2002 | Yamaguchi | H01L 21/561 257/666 |
| 6,525,405 B1 * | 2/2003 | Chun | H01L 21/4828 174/538 |
| 6,653,720 B2 * | 11/2003 | Kameda | H01L 21/563 257/667 |
| 6,940,154 B2 | 9/2005 | Pedron et al. | |
| 7,507,606 B2 * | 3/2009 | Ito | H01L 21/4821 438/106 |
| 7,563,648 B2 | 7/2009 | Islam et al. | |
| 8,742,551 B2 * | 6/2014 | Park | H01L 23/495 257/666 |

(Continued)

Primary Examiner — Robert Huber
Assistant Examiner — Gardner W Swan
(74) Attorney, Agent, or Firm — Seed Intellectual Property Law Group LLP

(57) ABSTRACT

Embodiments of the present disclosure are directed to leadframes having the cantilevered extension that includes an integral support on the end of the lead nearest the die pad. A support integral to the leadframe allows the support to be built to the proper height to support the cantilevered lead in each package and reduces or eliminates the upward, downward, and side to side deflections caused or allowed by supports built-in to the tooling of the manufacturing equipment. Also, by building the support into the leadframe, the leadframes may be pretaped prior to the die attach and wire bonding steps of the manufacturing process.

14 Claims, 9 Drawing Sheets

(56) References Cited

U.S. PATENT DOCUMENTS

| | | | | |
|---|---|---|---|---|
| 2005/0133913 A1* | 6/2005 | Okamoto | ............ | H01L 23/3107 257/737 |
| 2011/0089547 A1* | 4/2011 | Holloway | ............. | H01L 21/568 257/676 |
| 2012/0168921 A1* | 7/2012 | Tan | ..................... | H01L 21/4828 257/676 |
| 2013/0285222 A1* | 10/2013 | Park | ...................... | H01L 23/495 257/676 |

* cited by examiner

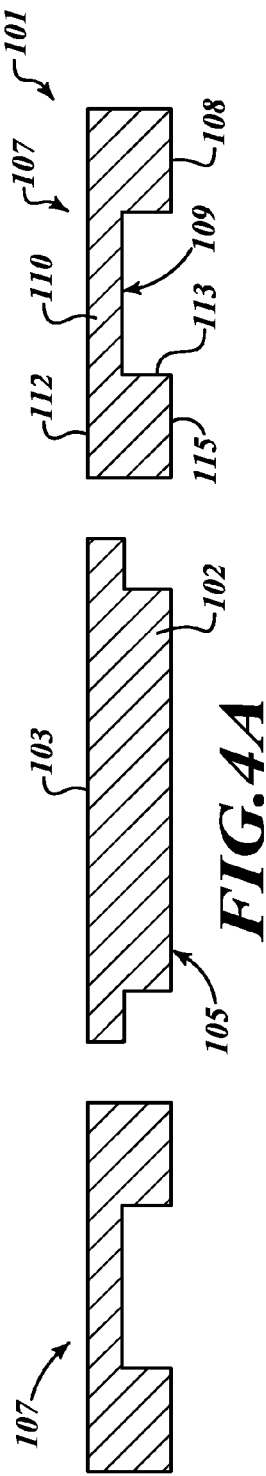
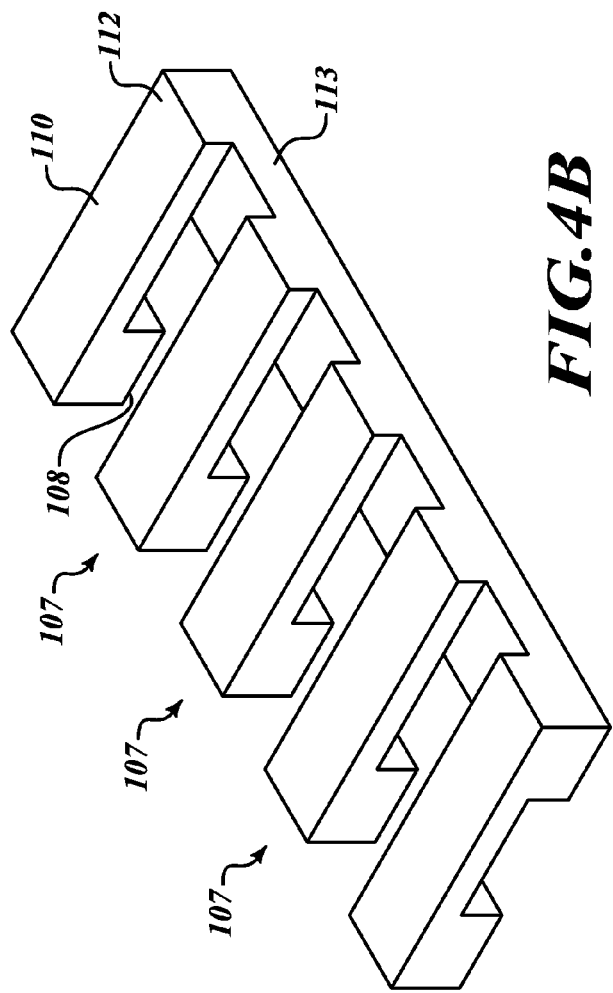

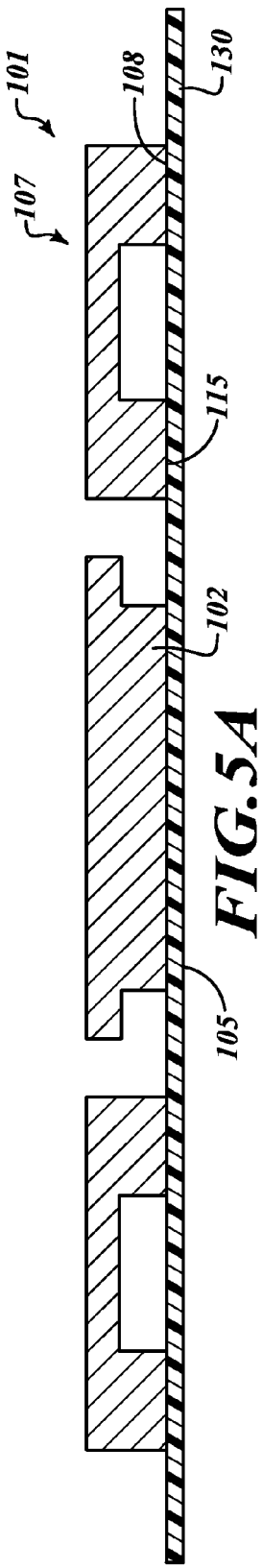
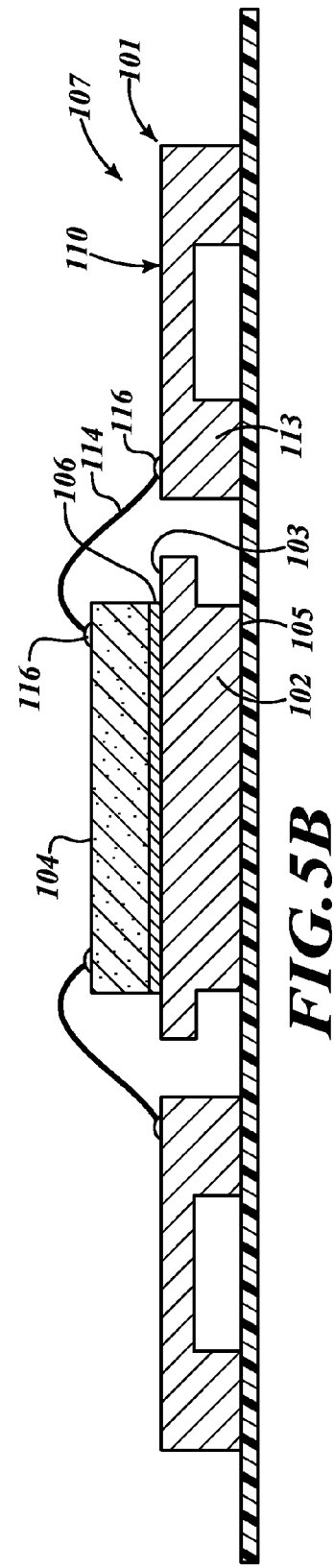

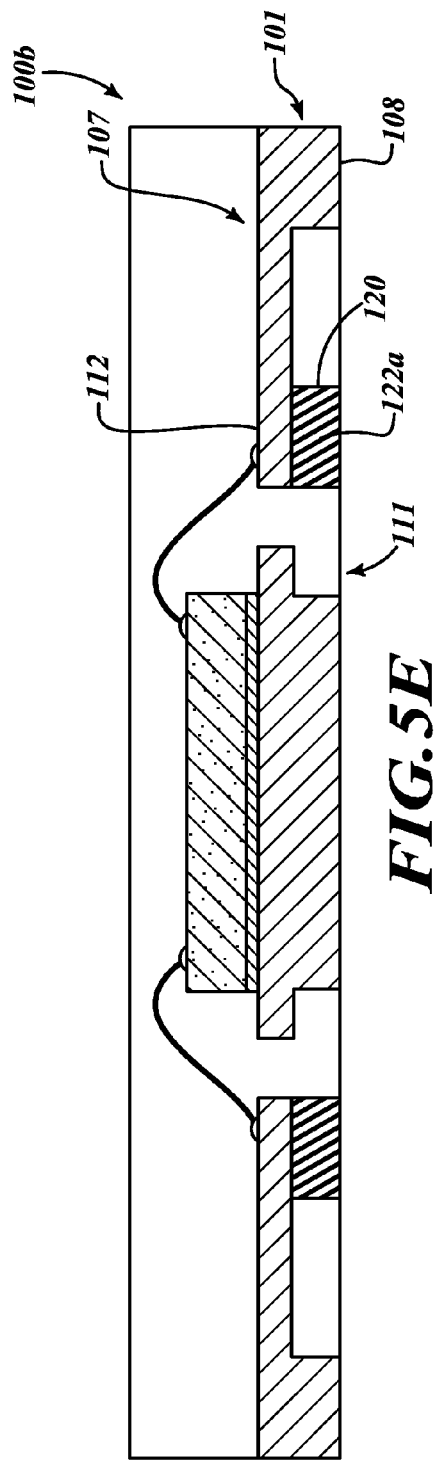
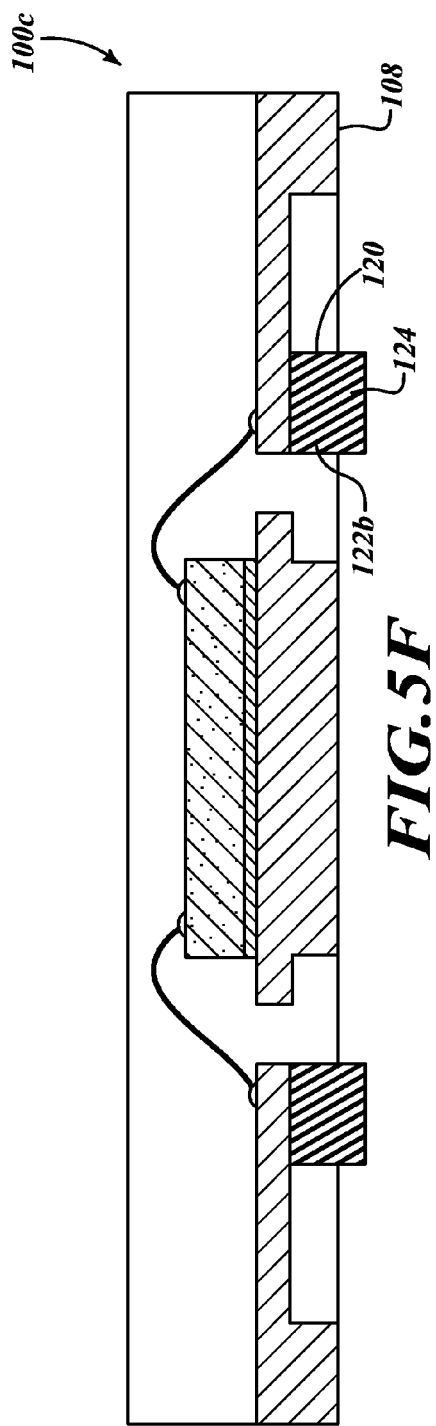

LEADFRAME PACKAGE WITH STABLE EXTENDED LEADS

BACKGROUND

Technical Field

Embodiments of the present disclosure are directed to leadframe packages and methods of manufacturing and assembling leadless packages.

Description of the Related Art

Leadless, or no lead packages are often utilized in applications in which small sized packages are desired. In general, flat leadless packages provide a chip scale or near chip-scale encapsulated package that includes a planar leadframe. Lands located on a bottom surface of the package provide electrical connection to a substrate, such as a printed circuit board (PCB). The leadless packages can be mounted directly on the surface of the PCB using surface mount technology (SMT).

The die in leadframe packages, and in particular quad-flat no lead packages are wire bonded to the ends of the leads in the package. The wire bonding process includes using a force and heat to apply the solder and attach a conductive wire to the lead and a semiconductor die. The leads in the quad flat no lead packages may be cantilevered and the conductive wire is bonded to the free end of the cantilevered lead. The force applied to the free end of the lead during the wire bonding process causes bending and deformation of the lead. Such bending and deformation can cause defects in the connection between the conductive wire and the lead and may lead to premature failure of leadframe packages.

The tooling used to manufacture leadframe packages may include an extension that supports the free end of the cantilevered lead during the wire bonding process, but due to variations in manufacturing, the extension may not properly support the cantilevered end of the lead. For example, if the support is too high, the lead may be biased upward during the wire bonding step, whereas if the support is too low, the lead may be biased downward during the wire bonding step. The extensions on the tooling also do not provide resistance to side to side forces, allowing the cantilevered leads to deform side to side, potentially causing misalignment of the lead and the conductive wire and additional defects.

Leadframe strips, which are composed of an array of units connected with tie bars, may be pre-taped during the manufacturing and assembly process for ease of handling and to aid in preventing encapsulant bleed out. When taped, the bottom surfaces of the leadframe strip are adhered to a tape, but, when the tooling includes extensions that support the cantilevered leads on a leadframe, the leadframe strip cannot be pre-taped because the tape interferes with the extension's ability to support the leads. Thus, when the extension is built into the tooling the leadframe strip is handled without tape until after the wire bonding step.

BRIEF SUMMARY

Embodiments of the present disclosure are directed to leadframes having cantilevered leads with that include an integral support on the end of the lead nearest a die pad. A support integral to the leadframe allows the support to be built to the correct height to support the cantilevered lead in each package and reduces or eliminates the upward, downward, and side to side deflections caused or allowed by supports built-in to the tooling of the manufacturing equipment. Also, by building the support into the leadframe, the leadframes may be pretaped prior to the die attach and wire bonding steps of the manufacturing process.

After the wire bonding and encapsulation steps in a leadframe package manufacturing process, the support structure may be etched away to create a cavity beneath the cantilevered end of the lead. This cavity may remain open or, in some embodiments, the cavity may be refilled or sealed. By etching away or otherwise removing the support, the lead is supported during manufacture of the package, but excess conductive material, which may cause shorting and other problems in the final device, is removed, thereby reducing or eliminating the potential for shorting electrical connections in the final package.

In one embodiment disclosed herein a semiconductor package includes a die pad having a die attach surface and a semiconductor die coupled to the die attach surface of the die pad. The semiconductor package may also include a plurality of leads spaced apart from at least one side of the die pad. Each of the plurality of leads has a first end and second end with lands at the second end of each of the plurality of leads. The first ends are nearer the die pad than the second ends. The leads include a cantilevered beam extending from the lands and forming the first end of the leads and has a first surface and a second surface opposite the first surface. The semiconductor package also includes encapsulation material located over the semiconductor die and a portion of the leads and a cavity formed in the encapsulation material that exposes a portion of the second surface of the leads.

BRIEF DESCRIPTION OF THE SEVERAL VIEWS OF THE DRAWINGS

FIG. 4A is a schematic illustration of a cross-sectional view of a leadframe in accordance with one embodiment.

FIG. 4B is an isometric view of a leads of a leadframe in accordance with one embodiment.

FIGS. 5A-5G are cross-sectional views illustrating the packages of FIGS. 1-3 being assembled at various stages of manufacture in accordance with one embodiment.

DETAILED DESCRIPTION

Figure 1:
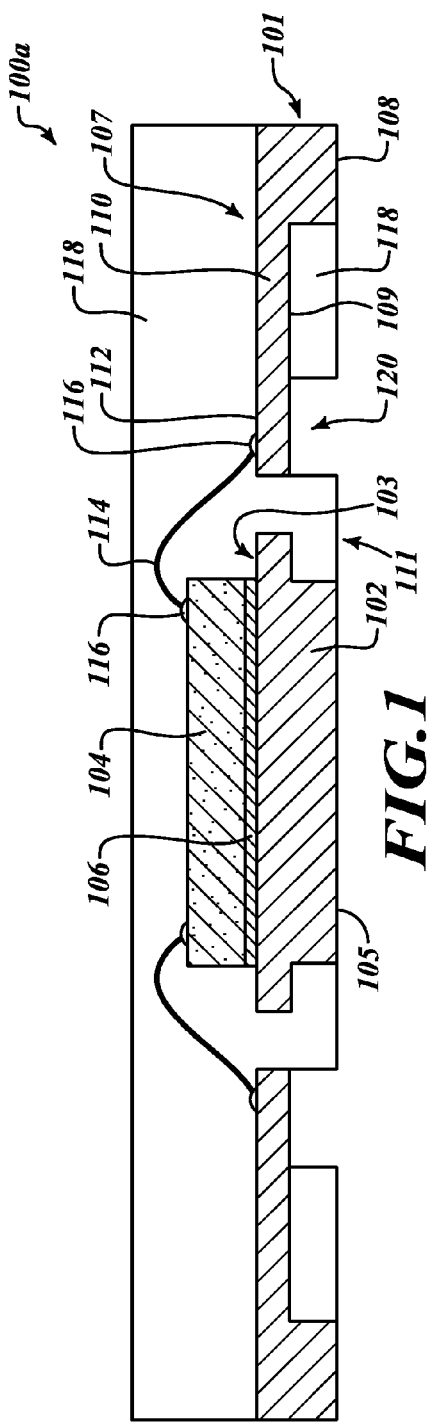
FIG. 1 is a schematic illustration of a cross-sectional view of a semiconductor package in accordance with one embodiment.

FIG. 1 shows a cross-sectional view of a leadframe package 100*a* made in accordance with one embodiment of the disclosure. The leadframe package 100*a* shows a die pad 102 and two leads 107 located on opposing sides of the die pad 102. The die pad 102 has an upper surface 103 and an opposite lower surface 105 and the leads 107 have upper surface 112 and a lower surface 108. The lower surfaces 108 of the leads 107 may also be referred to as the lands of the package 100*a*. The die pad 102 and the leads 107 are made of a conductive material, such as copper or a copper alloy.

The package includes a plurality of leads 107 on each side of the die pad 102. It is to be appreciated that any number of leads may be included in the package including one lead on just one side of the die pad 102. In some embodiments, the leads are provided on two sides or four sides of the die pad. For example, the leads may be on two parallel sides of the package or on four sides of a square or rectangular package.

The package 100a further includes a semiconductor die 104 coupled to the upper surface 103 of the die pad 102 by an adhesive material 106. The semiconductor die 104 is any semiconductor die configured to send and/or receive electrical signals. For instance, the semiconductor die may be an integrated circuit, micro-electromechanical sensor (MEMS), and any other electronic chip. The adhesive material 106 may be any material configured to hold the semiconductor die 104 in place during the assembly process. The adhesive material 106 may be double sided tape, epoxy, glue, or any suitable material for adhering the die 104 to the upper surface 103 of the die pad 102.

The semiconductor die 104 includes conductive pads 116 that are electrically connected to one or more electrical circuits formed in the semiconductor die 102, as is well known in the art. Conductive wires 114 electrically couple the semiconductor die 104 to the leads 107. For instance, a first end of the conductive wire 114 is coupled to a conductive pad 116 of the die 104 and a second end of the conductive wire 114 is coupled to a conductive pad 116 on the upper surface 112 of the first end of the lead 107.

Encapsulation material 118 is located over the die 104, die pad 102, and the leads 107, enclosing the die 104 and the conductive wires 114. The encapsulation material 118 is also located beneath the leads 107 and the die pad 102 and forms a portion of bottom surface 111 of the package 100a. The encapsulation material 118 may be any material configured to provide protection from environmental sources of damage, such as corrosion, physical damage, moisture damage, or other causes of damage to electrical devices. The encapsulation material 118 may be a molding compound that includes one or more of polymer, polyurethane, acrylic, epoxy resin, silicone, or any other suitable material.

In some embodiments, the package 100a includes a cavity 120 formed in the encapsulation material 118 below the end of the cantilevered portion of the lead 107. The cavity 120 may be formed via an etching process or other material removal process in which a support 113 that extends from the lead 107 is etched away. The support is shown in more detail in FIGS. 4A and 4B. In some embodiments, the support 113 is completely etched away such that the bottom surface 109 of a cantilevered portion 110 of the lead 107 is in a single plane. In some embodiments, the cavity 120 is formed by etching only a portion of the support 113 away such that the support 113 extends from the plane of the lower surface 109 of the cantilevered portion 110 of the lead 107, but the support 113 does not extend to the bottom surface 111 of the package 100a.

Figure 2:
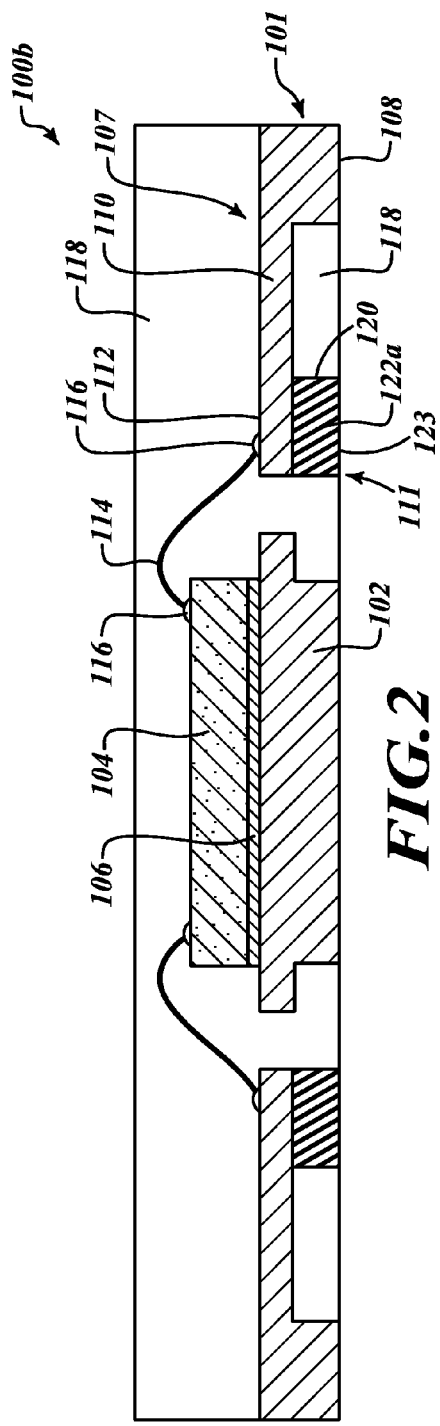
FIG. 2 is a schematic illustration of a cross-sectional view of a semiconductor package in accordance with one embodiment.

FIG. 2 shows a cross-sectional view of a leadframe package 100b made in accordance with one embodiment of the disclosure. The leadframe package 100b is similar to the leadframe package 100a and shows a die pad 102 and two leads 107 located on opposing sides of the die pad 102. The die pad 102 has an upper surface 103 and an opposite lower surface 105 and the leads 107 have upper surface 112 and a lower surface 108.

The package includes a plurality of leads 107 on each side of the die pad 102. It is to be appreciated that, similar to the leadframe package 100a, any number of leads may be included in the package including one lead 107 on just one side of the die pad 102 and that in some embodiments, the leads 107 are provided on two sides of the die pad, four sides of the die pad, or any number of sides of the die pad 102.

The package 100b further includes a semiconductor die 104 coupled to the upper surface 103 of the die pad 102 by an adhesive material 106. The semiconductor die 104 includes conductive pads 116 that are electrically connected to one or more electrical circuits formed in the semiconductor die 102, as is well known in the art. Conductive wires 114 electrically couple the semiconductor die 104 to the leads 107.

Encapsulation material 118 is located over the die 104, die pad 102 and the leads 107 enclosing the die 104 and the conductive wires 114. The encapsulation material 118 is also located between the leads 107 and the die pad 102 and forms a bottom surface 111 of the package 100b.

The package 100b includes a cavity 120 formed in the encapsulation material 118 below the end of the cantilevered portion of the lead 107. The cavity 120 may be formed via an etching process or other material removal process in which a support 113 that extends from the lead 107 is etched away. In some embodiments, the support 113 is completely etched away such that the bottom surface of the cantilevered portion 110 of the lead 107 is in a single plane. In some embodiments, the cavity 120 is formed by etching only a portion of the support 113 away such that the support 113 extends from the plane of the lower surface of the cantilevered portion 110 of the lead 107, but the support 113 does not extend to the bottom surface 111 of the package 100b.

In contrast to the embodiment shown in FIG. 1, in the embodiment shown in FIG. 2, the cavity 120 is backfilled to create a sealing member 122a. The material used to fill the cavity 120 and create the sealing member 122a may be the same as the encapsulation material 118 and may include a molding compound that includes one or more of polymer, polyurethane, acrylic, epoxy resin, silicone, or any other suitable material.

Leaving the cavity 120 unfilled, for example, as shown in FIG. 1, is suitable for many applications, in particular, applications in which foreign object debris, corrosion and other detrimental environmental effects are minimized. In some applications, particularly those in which debris, corrosion, and other environmental effects may compromise an exposed surface of the lead, sealing the cavity, which may include backfilling, may be desirable. For example, by filling the cavity 120 with a sealing member 122a, the formerly exposed portion of the lead 107 is sealed, thereby aiding in reducing corrosion and in preventing short-circuits that may be caused by debris or other contaminants that would otherwise enter an unsealed cavity 120.

In some embodiments, for example, as shown in FIG. 2, the bottom surface 123 of the sealing member 122a may be flush with the bottom surface 111 of the package 100b. The bottom surface 123 of the sealing member 122a may also be flush with the bottom surface of the lands, the bottom surface 108 of the leads. In this way, the bottom surface 111 of the package, the bottom surface 123 of the sealing member 122a, and the bottom surface 108 of the lead 107 may form a single planar surface.

Figure 3:
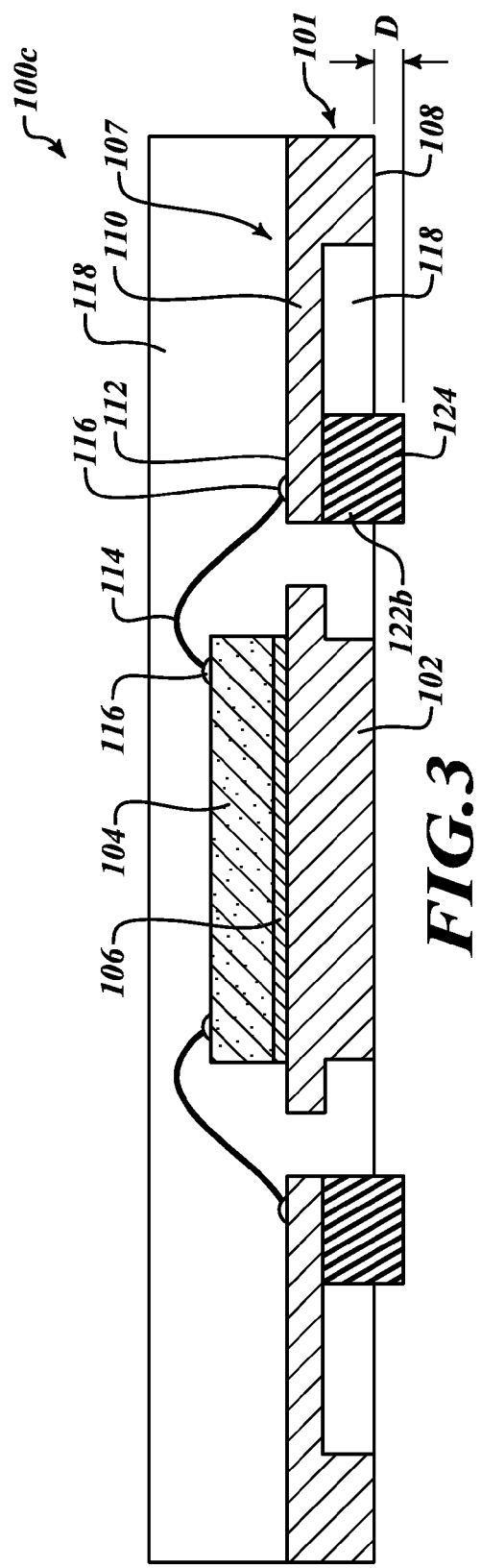
FIG. 3 is a schematic illustration of a cross-sectional view of a semiconductor package in accordance with one embodiment.

FIG. 3 shows a cross-sectional view of a leadframe package 100c made in accordance with one embodiment of the disclosure. The leadframe package 100c is similar to the leadframe package 100a and the leadframe package 100b and shows a die pad 102 and two leads 107 located on opposing sides of the die pad 102. The die pad 102 has an upper surface 103 and an opposite lower surface 105 and the leads 107 have upper surface 112 and a lower surface 108.

The leadframe package 100c includes a plurality of leads 107 on each side of the die pad 102. It is to be appreciated that, similar to the leadframe package 100a, any number of leads may be included in the package including one lead on just one side of the die pad 102, and that in some embodiments, the leads are provided on two sides of the die pad, four sides of the die pad, or any number of sides of the die pad.

The package 100c further includes a semiconductor die 104 coupled to the upper surface 103 of the die pad 102 by an adhesive material 106. The semiconductor die 104 includes conductive pads 116 that are electrically connected to one or more electrical circuits formed in the semiconductor die 102, as is well known in the art. Conductive wires 114 electrically couple the semiconductor die 104 to the leads 107.

Encapsulation material 118 is located over the die 104, die pad 102 and the leads 107 enclosing the die 104 and the conductive wires 114. The encapsulation material 118 is also located between the leads 107 and the die pad 102 and forms a bottom surface 111 of the package 100c.

The package 100c includes a cavity 120 formed in the encapsulation material 118 below the end of the cantilevered portion of the lead 107. The cavity 120 may be formed via an etching process or other material removal process in which a support 113 that extends from the lead 107 is etched away. In some embodiments, the support 113 is completely etched away such that the bottom surface of the cantilevered portion 110 of the lead 107 is in a single plane. In some embodiments, the cavity 120 is formed by etching only a portion of the support 113 away such that the support 113 extends from the plane of the lower surface of the cantilevered portion 110 of the lead 107, but the support 113 does not extend to the bottom surface 111 of the package 100c.

In contrast to the embodiment shown in FIGS. 1 and 2, in the embodiment shown in FIG. 3, the cavity 120 is backfilled to create a sealing member 122b with an extension 124 that extends beyond the plane of the bottom surface 111 of the package 100c. The extension 124 of the sealing member 122b extends beyond the plane of the bottom surface 111, a distance D.

The extension 124 aides in separating the bottom surface 111 of the package 100c from a surface of a substrate, such as a printed circuit board, to which the package 100c may be attached, for example, when the package 100c is integrated into an electronic device.

The bondline thickness of an electronic device is the thickness of the filler material, such as solder, that bonds a conductive element, such as a land, of the package with an conductive element, such as a bond pad, of the substrate to which the package is attached. The bondline thickness affects the quality and cost of the joint between the package and the substrate. If the bond line thickness of the solder or other filler material is too thick, then filler material is wasted and manufacturing costs increase, but if the bondline thickness is too thin, then the joint may be weak and susceptible to failure. For example, the joint may fail due to fatigue caused by varying magnitudes of thermal expansion between the package and the substrate due to different coefficients of thermal expansion between the two parts. Therefore, the extensions 124 set the bondline thickness D at a predictable and repeatable height that provides for adequate reliability and fatigue resistance. The extensions 124 also reduce variability in the bondline thickness from part to part and also aid in creating a reliable joint. An example of such a joint formed between the package 100c and a substrate 50 is shown in FIG. 5G.

With reference to FIGS. 4A and 4B, an embodiment of bare leadframe 101 will now be described. FIG. 4A shows a cross-section of the bare leadframe 101 and FIG. 4B shows an isometric view of the leads 110 of the leadframe 101.

FIG. 4A shows a cross-sectional view of a leadframe 101 made in accordance with one embodiment of the disclosure. The leadframe 101 includes a die pad 102 and two leads 107 located on opposing sides of the die pad 102. The die pad 102 has an upper surface 103 and an opposite lower surface 105 and the leads 107 have upper surface 112 and a lower surface 108.

The leads 107 include a cantilevered portion 110 that extends from the end of the lead furthest from the die pad 102 and is supported by a support structure 113 at the end nearest the die pad 102. The cantilevered portion 110 also includes a lower surface 109 that is in a plane different from the plane of the lower surface 108 that comprises the land.

FIG. 4B shows a detailed isometric view of a plurality of leads 107 that may be spaced apart from the die pad 102. In the embodiment shown in FIG. 4B, the support structure 113 is a continuous bar that extends along the length the leadframe 101. The support structure 113 extends from and connects the ends of the cantilevered portions 110 of each of the plurality of leads 107.

By connecting the ends of multiple leads 107 together, the support structure 113 aids in preventing deflection of the cantilevered portion 110 of the lead 107 in both up and down directions, up and down in FIG. 4A, and in side to side directions, which is in a direction into and out of the page in FIG. 4A.

In some embodiments, the leadframe 101 may have a plurality of support structures 113. Each of the plurality of support structures 113, may extend from and be connected to multiple leads 107.

In some embodiments, a single support structure 113 may extend from a single, respective, cantilevered portion 110 of a lead 107, such that each support structure 113 is independent from each other support structure 113. Independent support structures do not resist side to side movement of the cantilevered portion 110 of a lead 107 in the same way that connected support structures 113 would, but such support structures may require less material etching than connected support structures 113 during the removal process described below with respect to FIG. 5D.

FIGS. 5A through 5G illustrate various stages of manufacturing of the packages 100a, 100b, 100c of FIGS. 1 through 3, in accordance with one or more embodiments disclosed herein.

FIG. 5A shows the leadframe 101 and a portion of an embodiment of a method of producing a leadframe package. The leadframe 101 is a conductive material, such as metal, and in some embodiments is made of copper or a copper alloy. The leadframe 101 is formed to have a die pad 102 and leads 107. As shown in FIG. 5A, tape 130 is applied to the bottom surfaces 103, 115, 108 of the leadframe 101. In some embodiments the leadframe 101 may be one of many leadframes connected together in a strip to which the tape 130 is applied.

FIG. 5B another portion of an embodiment of method of producing a leadframe package. As shown in FIG. 5B, an adhesive material 106 is applied to the top surface 103 of the die pad 102. After application of the adhesive material 106, a die 104 is attached to the die pad 102 of the leadframe 101.

After installation of the die 104, conductive wire 114 is attached between the die and the leads 107. A first end of the conductive wire 114 is attached to conductive pad 116 on the die 104 and a second end of the conductive wire 114 is attached to the conductive pad 116 at the end of an adjacent lead 107. During this process, the support structure 113 supports the cantilevered portion 110 of the lead 107 and aids in reducing or preventing deflection of the cantilevered portion 110 of the lead 107.

Figure 5C:
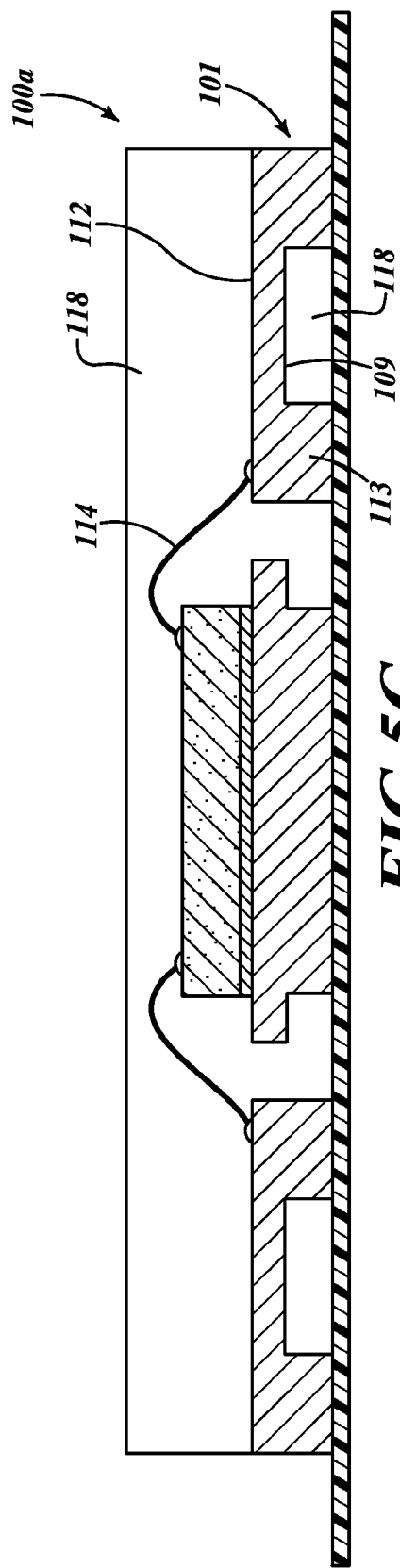

As shown in FIG. 5C, after installation of the conductive wire 114, encapsulation material 118 is formed over the leadframe 101 such that the encapsulation material 118 surrounds the die 102, the conductive wires 114, and the upper surfaces 112 and the lower surface 109 of the leads 107. The encapsulation material 118 may be formed on the leadframe 101 by conventional techniques, for example by a molding process, and in some embodiments is hardened during a curing step.

Figure 5D:
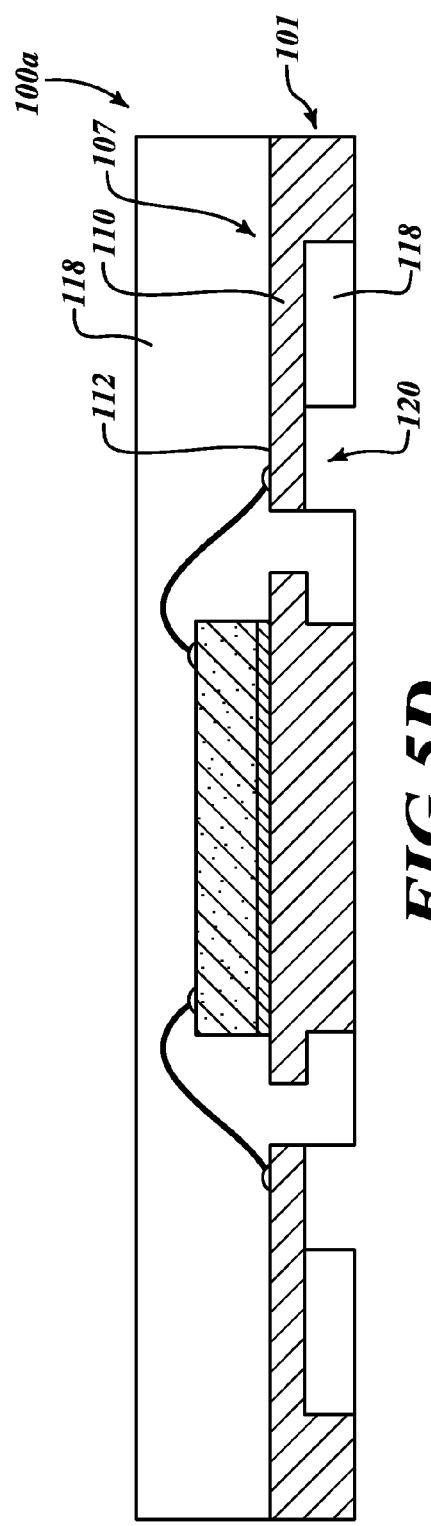
Figure 5G:
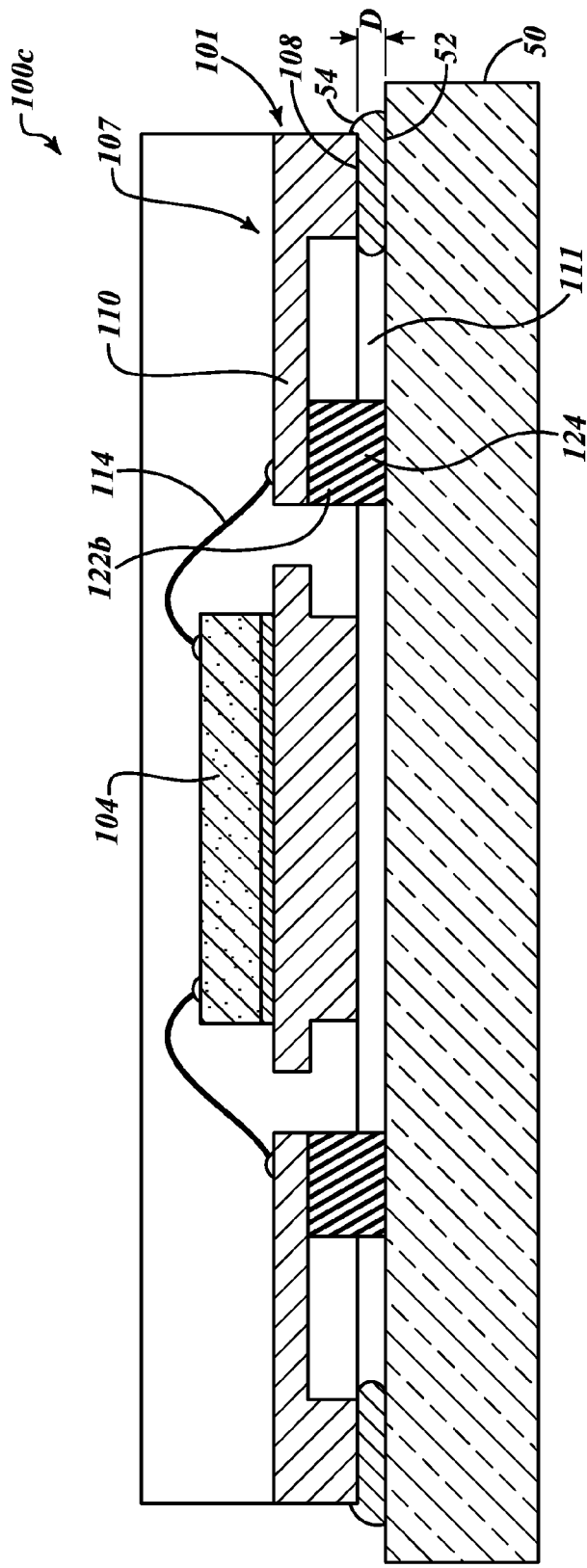
Figure 6A:
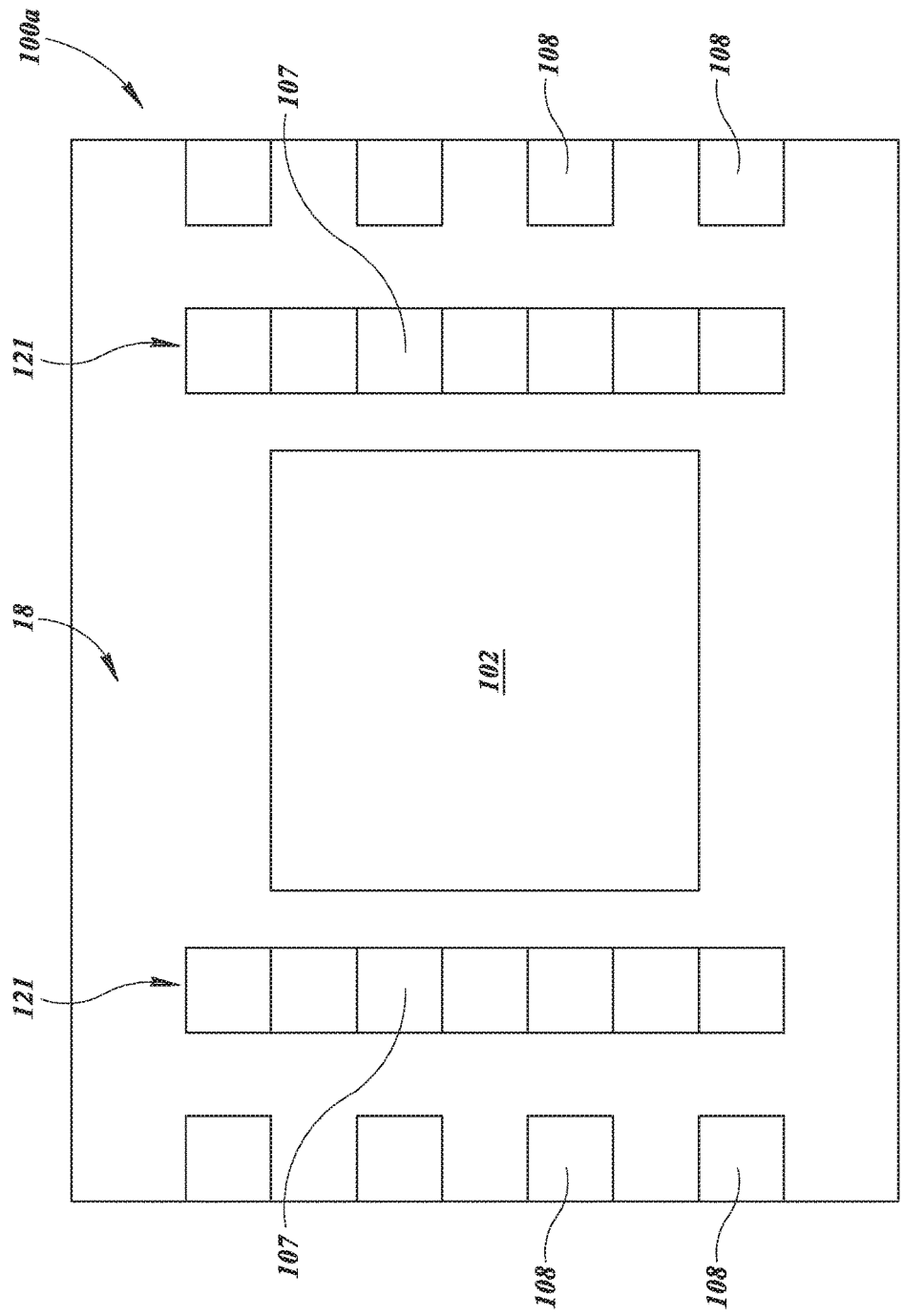
FIG. 6A is a schematic illustration of a bottom view of a package being formed at the stage shown in FIG. 5D.
Figure 6B:
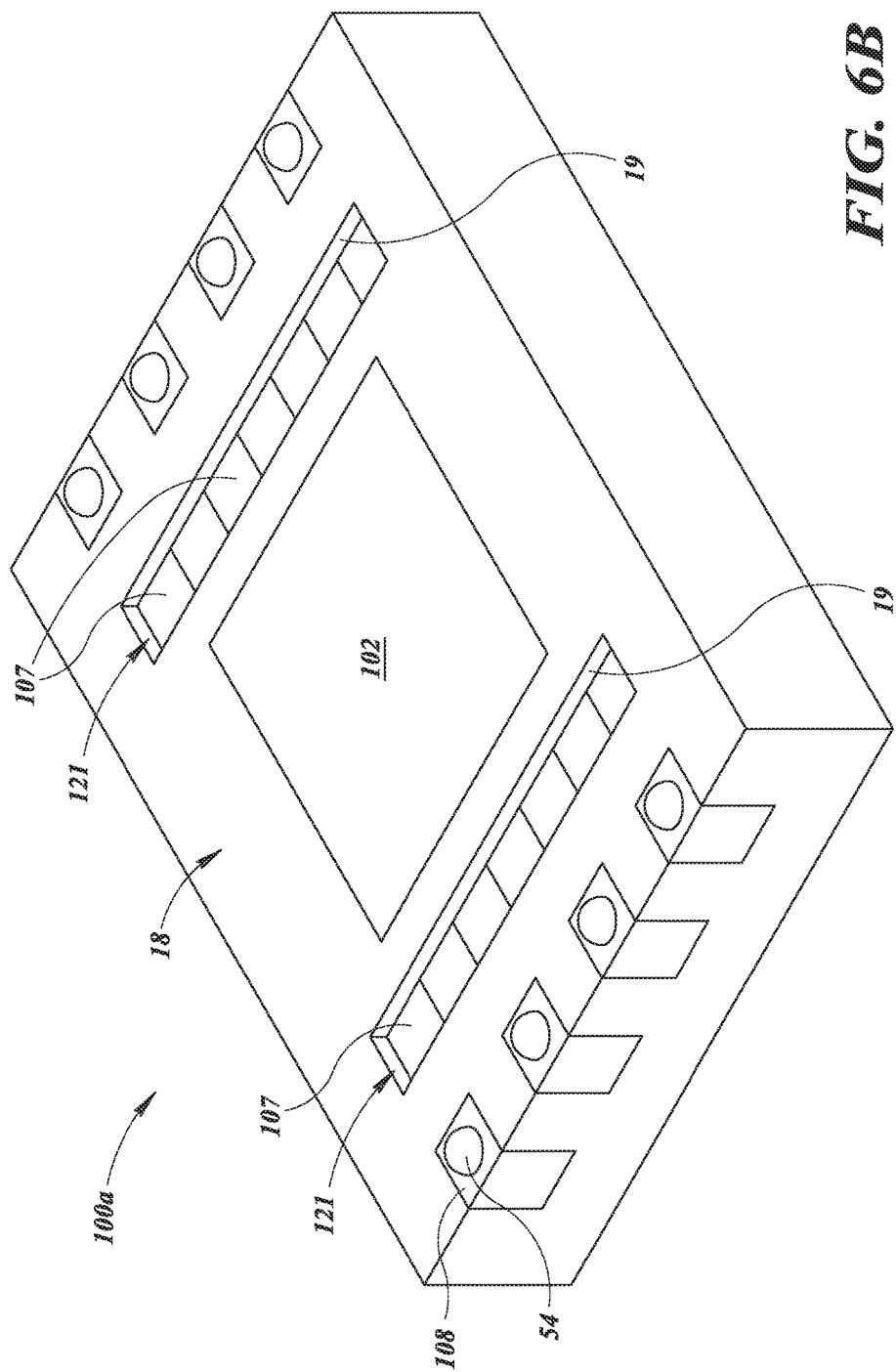
FIG. 6B is a schematic illustration of an isometric bottom view of the package of FIG. 6B with conductive bumps.

As shown in FIG. 5D, after the encapsulation material 118 is formed over the leadframe 101, the tape 130 may be removed from the bottom surfaces of the leadframe 101. Also, shown in FIG. 5D is the removal of the support structure 113 and formation of the cavity 120. The cavity 120 is formed using standard semiconductor processing techniques, including patterning with light sensitive materials and etching techniques. In some embodiments, for example, wherein the support structure 113 extends from and connects the cantilevered portions 110 of a plurality of leads 107, the cavity may be an elongated trench. See for example FIGS. 6A and 6B illustrating a single, continuous cavity 121 in the encapsulation material 18 that exposes the first ends of the plurality the leads 107 at the second surfaces of the cantilevered beams and exposes surfaces 19 of the encapsulation material 18 to an environment outside the semiconductor package. FIG. 6B shows the package with conductive bumps 54. In an embodiment wherein each lead 107 has an independent support structure 113, multiple independent cavities 120 may be formed, each one of the multiple independent cavities being beneath a lead 107. In some embodiments, the leadframe package 100a may be complete after formation of the cavities 120 and may be subsequently coupled to a substrate, such as a printed circuit board.

In FIG. 5E, the cavities 120 are sealed with a sealing member 122a that has a bottom surface in the same plane as the bottom surface 111 of the leadframe package 100b and also in the same plane as the bottom surface 108, the land, of the lead 107. In some embodiments, the leadframe package 100b may be complete after formation of the cavities 120 and may be subsequently coupled to a substrate, such as a printed circuit board.

In FIG. 5F, the cavities 120 are sealed with a sealing member 122b that includes an extension 124 that extends a distance beyond the plane of the bottom surface 111 of the leadframe package 100c, and also a distance beyond the plane of the bottom surface 108, the land, of the lead 107. In some embodiments, the leadframe package 100c may be complete after formation of the cavities 120 and may be subsequently coupled to a substrate, such as a printed circuit board, for example, as shown in FIG. 5G.

In FIG. 5G the leadframe package 100c is coupled to the substrate 50 via filler material 54, which may be solder. The lands 108 of the leadframe package 100c may be coupled to the conductive pads 52 of the substrate 50 via the solder. In this way, electronic signals from the die 104 may pass through the conductive wires 114, then through the leads 107, the filler material 54, and into the substrate 50.

The bondline thickness of the filler material 54 may be approximately equal to the distance D, which represents the distance. The extension 124 extends beyond the plane of the bottom surface 111 of the leadframe package 100c.

The various embodiments described above can be combined to provide further embodiments. All of the U.S. patents, U.S. patent application publications, U.S. patent applications, foreign patents, foreign patent applications and non-patent publications referred to in this specification and/or listed in the Application Data Sheet are incorporated herein by reference, in their entirety. Aspects of the embodiments can be modified, if necessary to employ concepts of the various patents, applications and publications to provide yet further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A semiconductor package, comprising:
   a die pad having a die attach surface;
   a semiconductor die coupled to the die attach surface of the die pad;
   a plurality of leads spaced apart from at least one side of the die pad, the plurality of leads having first ends and second ends, the first ends being nearer the die pad than the second ends;
   lands at the second ends of the plurality of leads;
   cantilevered beams extending from the lands and forming the first ends of the leads, each of the cantilevered beams having a first surface and a second surface opposite the first surface;
   encapsulation material located over the semiconductor die and portions of the leads, including the first surfaces and portions of the second surfaces of the cantilevered beams; and
   a single, continuous cavity in the encapsulation material that exposes the first ends of the plurality of leads at the second surfaces of the cantilevered beams and exposes a surface of the encapsulation material to an environment outside the semiconductor package.

2. The semiconductor package of claim 1, further comprising a conductive wire coupling the semiconductor die to the first surface of one of the cantilevered beams.

3. The semiconductor package of claim 1 wherein the single, continuous cavity is a trench exposing side surfaces of the encapsulation material.

4. The semiconductor package of claim 1 wherein the single, continuous cavity is a first single, continuous cavity on a first aide of the semiconductor die. the semiconductor package including a second single, continuous cavity on a second side of the semiconductor die.

5. The semiconductor package of claim 1, further comprising a plurality of conductive bumps coupled to the lands.

6. The semiconductor package of claim 1 wherein the die pad has a surface that is exposed to the outside environment.

7. An electronic device, comprising:
   a semiconductor package including:
     a die pad having a die attach surface;
     a semiconductor die coupled to the die attach surface of the die pad;
     a plurality of leads located near and spaced apart from at least one side of the die pad, the plurality of leads having first ends and second ends, the first ends being nearer the die pad than the second ends, the second ends of the plurality of leads forming lands, cantilevered beams extending from the second ends and forming the first ends of the leads;

encapsulation material located over the semiconductor die and portions of the leads; and a single, continuous, and unfilled trench that extends below and exposes the first ends of the plurality of leads and through the encapsulation material between the first ends of the plurality of leads;

a substrate having a plurality of first conductive pads; and conductive bumps coupling the lands of the semiconductor package to the plurality of first conductive pads of the substrate.

8. The electronic device of claim 7 wherein the trench extends along a side of the die pad.

9. The electronic device of claim 7 wherein the semiconductor die has a plurality of second conductive pads, the plurality of second conductive pads being coupled to the first ends of the plurality of leads.

10. The leadless semiconductor package of claim 7 wherein the die pad has a surface that is exposed to the outside environment.

11. A leadless semiconductor package, comprising:

a die pad having a die attach surface;

a semiconductor die coupled to the die attach surface of the die pad;

a plurality of leads spaced apart from at least one side of the die pad, the plurality of leads having first ends and second ends, the first ends facing the die pad, the second ends of the plurality of leads forming lands, the plurality of leads including a plurality of cantilevered beams forming the first ends of the plurality of leads, the plurality of cantilevered beams having first surfaces and second surfaces, the second surfaces being opposite the first surfaces;

a plurality of conductive wires coupling the semiconductor die to the first surfaces of the plurality of cantilevered beams;

an encapsulation material located over the semiconductor die, the first surfaces of the plurality of cantilevered beams, and first portions of the second surfaces of the plurality of cantilevered beams; and an elongated, single, continuous trench in the encapsulation material exposing the second surfaces of the plurality of cantilevered beams to an environment outside the leadless semiconductor package.

12. The leadless semiconductor package of claim 11 wherein the die pad has a surface that is exposed to the outside environment.

13. The leadless semiconductor package of claim 11 wherein the semiconductor die has a plurality of first conductive pads coupled to the first ends of the plurality of leads.

14. The leadless semiconductor package of claim 11 wherein the elongated, single, continuous trench is one of a plurality of elongated, single, continuous trenches, each trench extending along one side of the die pad.

\* \* \* \* \*

UNITED STATES PATENT AND TRADEMARK OFFICE
CERTIFICATE OF CORRECTION

PATENT NO. : 9,847,281 B2
APPLICATION NO. : 14/788303
DATED : December 19, 2017
INVENTOR(S) : Jefferson Talledo It is certified that error appears in the above-identified patent and that said Letters Patent is hereby corrected as shown below:

In the Claims

Column 8, Lines 51-53 Claim 4:
"a first single, continuous cavity on a first aide of the semiconductor die. the semiconductor package including" should read, --a first single, continuous cavity on a first side of the semiconductor die, the semiconductor package including--.

Signed and Sealed this
Fourth Day of December, 2018

Andrei Iancu
*Director of the United States Patent and Trademark Office*